(12) United States Patent
Wuu et al.

(10) Patent No.: US 7,342,261 B2
(45) Date of Patent: Mar. 11, 2008

(54) LIGHT EMITTING DEVICE

(75) Inventors: Dong-Sing Wuu, No. 50, Alley 30, Lane 107, Mei-Tsun S. Rd., Nan. Dist., Taichung City (TW); Ray-Hua Horng, Taichung (TW); Woei-Kai Wang, Taichung Hsien (TW)

(73) Assignee: Dong-Sing Wuu, Taichung (TW)

( * ) Notice: Subject to any disclaimer, the term of this patent is extended or adjusted under 35 U.S.C. 154(b) by 501 days.

(21) Appl. No.: 11/129,307

(22) Filed: May 16, 2005

(65) Prior Publication Data

US 2006/0267025 A1   Nov. 30, 2006

(51) Int. Cl.
*H01L 21/00* (2006.01)

(52) U.S. Cl. ............... 257/190; 257/283; 257/E21.125; 257/E21.126; 257/E21.131; 257/79

(58) Field of Classification Search ................ 257/190, 257/183, E21.125, E21.126, E21.131
See application file for complete search history.

(56) References Cited

U.S. PATENT DOCUMENTS

2003/0092263 A1* 5/2003 Koike et al. ................ 438/689
2003/0203531 A1* 10/2003 Shchukin et al. ............. 438/77

* cited by examiner

*Primary Examiner*—Zandra V. Smith
*Assistant Examiner*—Tsz K Chiu
(74) *Attorney, Agent, or Firm*—Foley & Lardner LLP (57) ABSTRACT

A light emitting device includes a substrate having a patterned surface and formed with a plurality of spaced apart cavities, and an epitaxial layer formed on the patterned surface of the substrate, having a patterned surface that is in face-to-face contact with the patterned surface of the substrate, and formed with a plurality of protrusions that protrude from the patterned surface of the epitaxial layer and that are respectively received in the cavities. Each of the protrusions is polygonal in shape and defines a plurality of vertices. The vertices of each of the protrusions contact the cavity-defining wall of the respective one of the cavities so as to form a plurality of closed pores between each of the protrusions and the cavity-defining wall of the respective one of the cavities.

15 Claims, 12 Drawing Sheets

LIGHT EMITTING DEVICE

BACKGROUND OF THE INVENTION

1. Field of the Invention

This invention relates to a light emitting device, more particularly to a high efficient light emitting device including a substrate that has a plurality of closed pores formed therein.

2. Description of the Related Art

Since light emitting diodes have a relatively small size, they have been widely utilized in back light modules, computers, traffic lights, and outdoor displays. However, the application of the light emitting diode encounters a problem of insufficient light output. Skilled artisans have tried to solve the problem in various aspects. For example, epitaxial technology has been developed to increase concentrations of donors and acceptors in an active layer of the light emitting diode, and to decrease dislocation density of the active layer. Nevertheless, it is difficult to increase the concentration of acceptors in the active layer, particularly in a gallium nitride (GaN) semiconductor system having a wide energy gap. Since there is a relatively high degree of lattice mismatch between sapphire substrate and gallium nitride layer formed on the sapphire substrate in the conventional light emitting diode, it is difficult to make a breakthrough in reducing dislocation density of the active layer.

Figure 1:
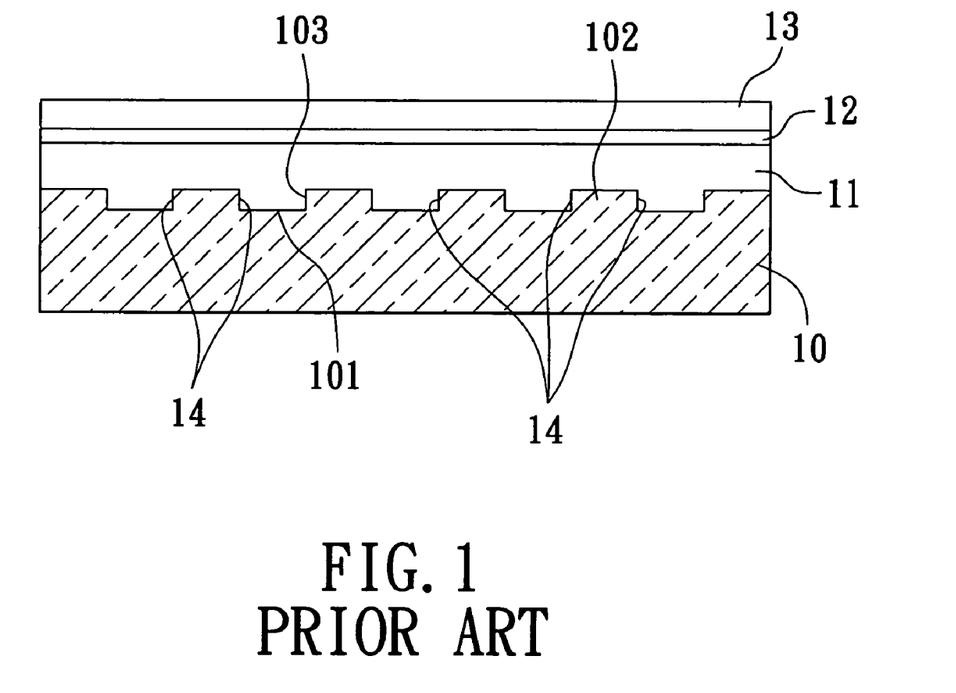
FIG. 1 is a schematic view of a conventional semiconductor light emitting device.

Referring to FIG. 1, a conventional semiconductor light emitting device, which is described in Taiwanese Patent Publication No. 561632, includes a sapphire substrate 10, an n-type semiconductor layer 11 formed on the sapphire substrate 10, a light emitting layer 12 that is formed on the n-type semiconductor layer 11 and that serves as a light emitting layer to emit light beams within a predetermined wavelength range, and a p-type semiconductor layer 13 formed on the light emitting layer 12.

The sapphire substrate 10 is formed with a plurality of trenches 14, and a plurality of protrusions 102 separated by the trenches 14. The sapphire substrate 10 has a main face defined as C face (0001). Each of the trenches 14 is defined by a trench-defining bottom surface 101 and a trench-defining peripheral surface 103. The trench-defining peripheral surface 103 is generally parallel to a stabilized growth surface (i.e. M surface $\{1\bar{1}00\}$) of the n-type semiconductor layer 11, so as to form the n-type semiconductor layer 11 on the sapphire substrate 10 without crystal defects. Each of the trenches 14 has a depth of 1 μm and a size of 10 μm, and is spaced apart from an adjacent one of the trenches 14 by a center-to-center distance of 10 μm.

Figure 2:
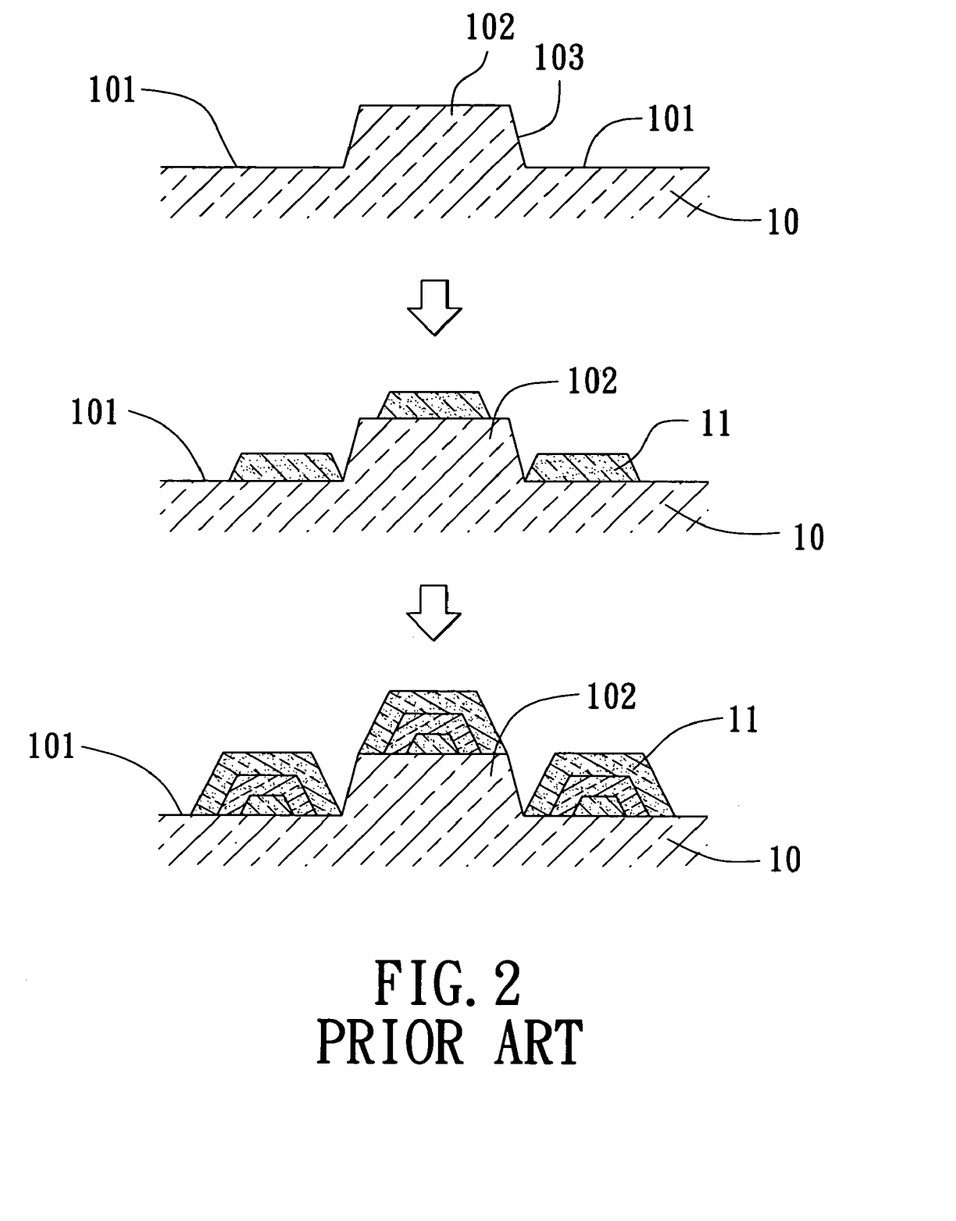
FIGS. 2 and 3 are schematic views to illustrate consecutive steps in forming an n-type semiconductor layer on a sapphire substrate.
Figure 3:
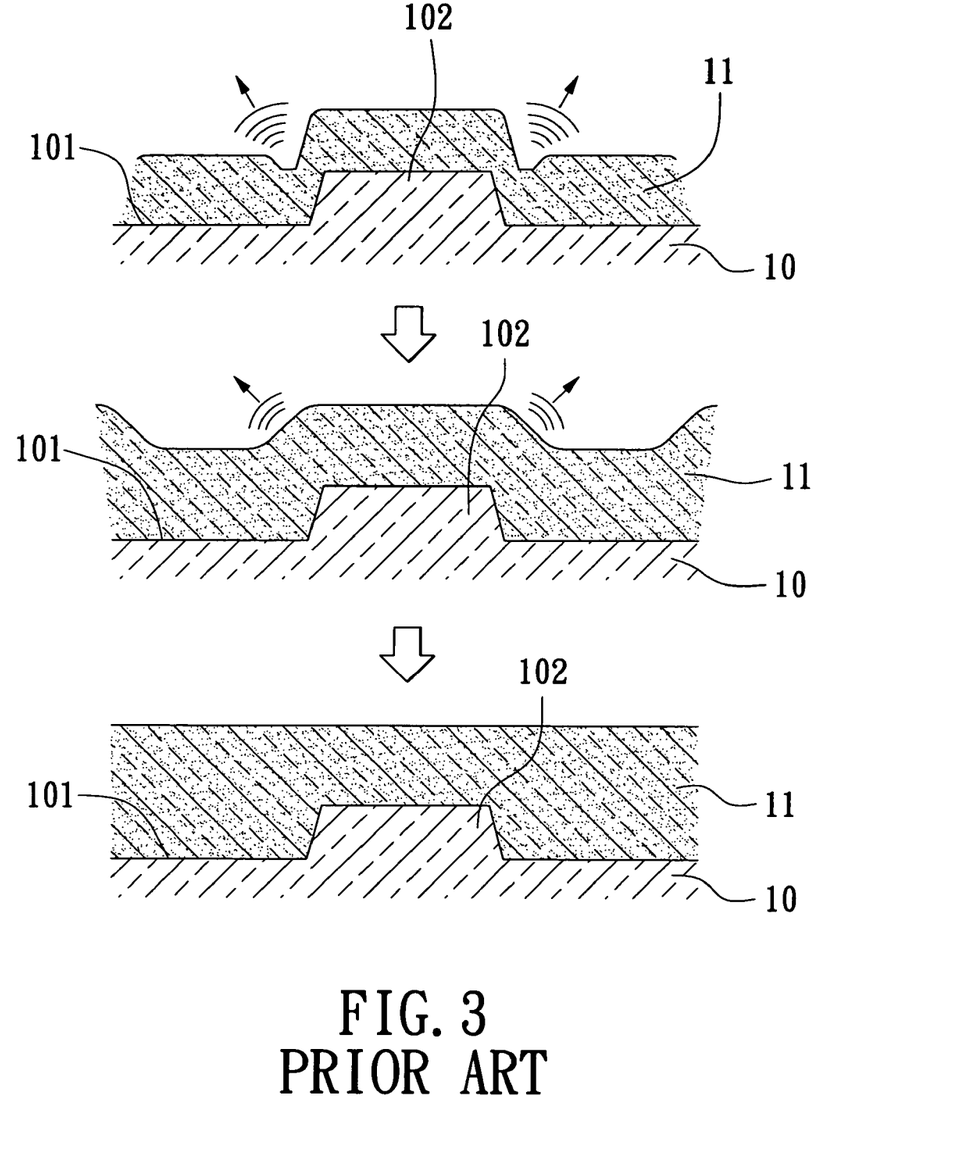

FIG. 2 illustrates how the n-type semiconductor layer 11 is grown on the protrusions 102 of the sapphire substrate 10, and the trench-defining bottom surface 101 and the trench-defining peripheral surface 103 of each trench 14. For simplicity, only one protrusion 102 is shown. When the n-type semiconductor layer 11 starts growing from the sapphire substrate 10, the growth rate of the n-type semiconductor layer 11 on the trench-defining bottom surface 101 and the protrusion 102 is relatively higher than that on the trench-defining peripheral surface 103. As shown in FIG. 3, when the n-type semiconductor layer 11 continues to grow to an extent such that the n-type semiconductor layer 11 on the trench-defining bottom surface 101 intersects the n-type semiconductor layer 11 on the protrusion 102, the growth rate of the n-type semiconductor layer 11 at the intersection area becomes faster than that at the remaining area. The resultant n-type semiconductor layer 11 thus formed on the sapphire substrate 10 is planar and void-free, and has a relatively good crystallinity.

By virtue of the trenches 14 in the sapphire substrate 10, the light beams from the light emitting layer 12 can scatter and diffract in the light emitting device so as to reduce absorption and decay of the light beams due to lateral transmission and so as to enhance external quantum efficiency of the light emitting device. In addition, since no crystal defect is produced in the interface between the sapphire substrate 10 and the n-type semiconductor layer 11, the internal quantum efficiency of the light emitting device is also enhanced.

Nevertheless, as well-known to those skilled in the crystallography field, lattice mismatch frequently occurs at the interface between two materials that have different lattice constants. Dislocation density (i.e. line defects) resulting from the lattice mismatch will be higher with a larger contact area between the two materials.

SUMMARY OF THE INVENTION

Therefore, the object of the present invention is to provide a light emitting device that is clear of the aforesaid drawback of the prior art.

According to this invention, a light emitting device includes a substrate having a patterned surface and formed with a plurality of spaced apart cavities that are indented inwardly from the patterned surface, each of the cavities being defined by a cavity-defining wall, and an epitaxial layer formed on the patterned surface of the substrate, having a patterned surface that is in face-to-face contact with the patterned surface of the substrate, and formed with a plurality of protrusions that protrude from the patterned surface of the epitaxial layer and that are respectively received in the cavities, each of the protrusions being polygonal in shape and defining a plurality of vertices. The vertices of each of the protrusions contact the cavity-defining wall of the respective one of the cavities so as to form a plurality of closed pores between each of the protrusions and the cavity-defining wall of the respective one of the cavities.

BRIEF DESCRIPTION OF THE DRAWINGS

Other features and advantages of the present invention will become apparent in the following detailed description of the preferred embodiment of this invention, with reference to the accompanying drawings, in which.

DETAILED DESCRIPTION OF THE PREFERRED EMBODIMENT

Figure 4:
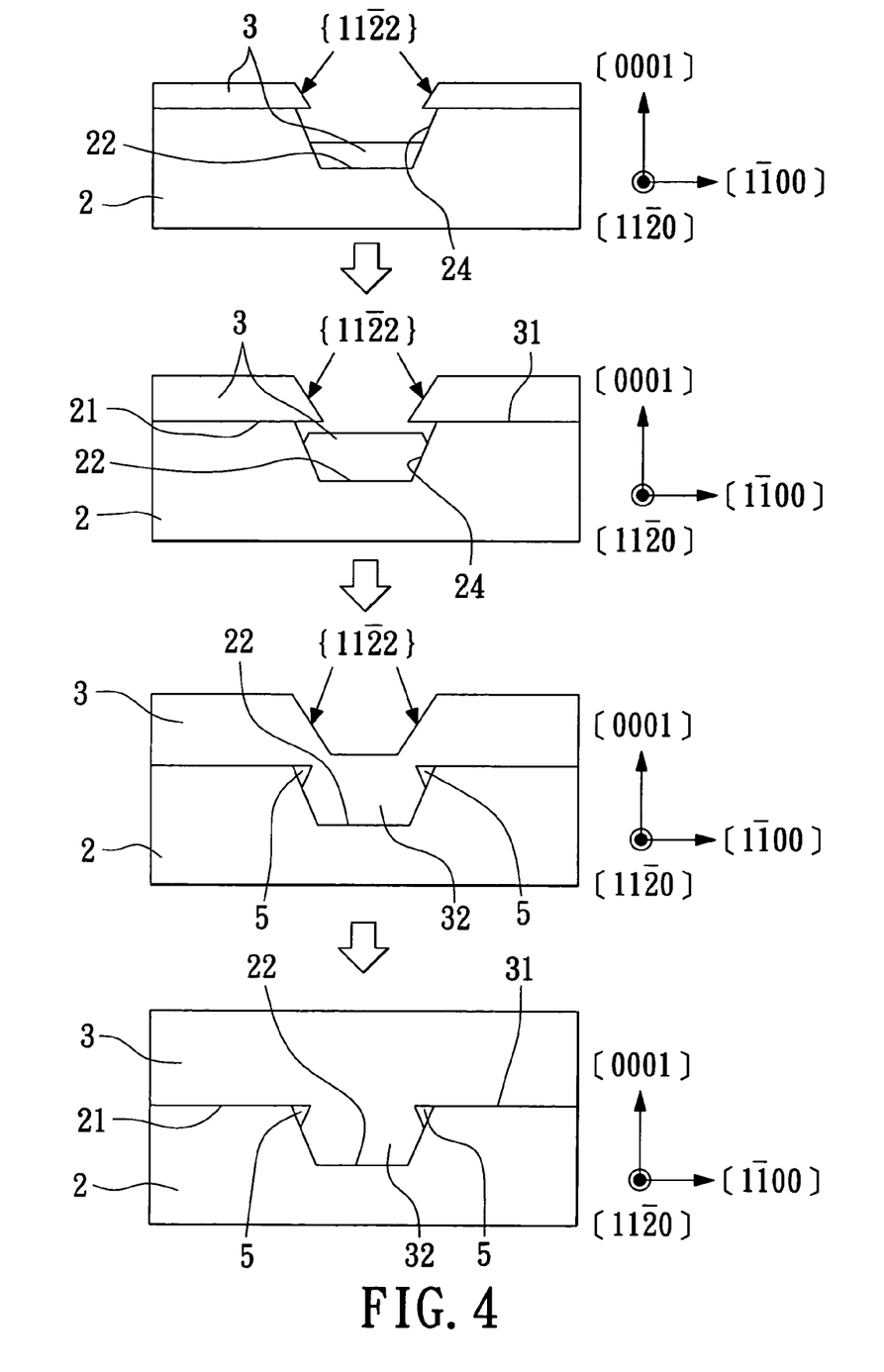
FIG. 4 is a schematic view to illustrate consecutive steps of forming an epitaxial layer on a substrate of the preferred embodiment of a light emitting device according to the present invention.

FIG. 4 explains how an epitaxial layer 3 is formed on a substrate 2 of the preferred embodiment of a light emitting device according to the present invention. Preferably, the substrate 2 is a sapphire substrate. The sapphire substrate 2 has a patterned surface 21, and is formed with a plurality of spaced apart cavities 22 that are indented inwardly from the patterned surface 21 (only one cavity 22 is shown). Each of the cavities 22 is defined by a cavity-defining wall 24. The epitaxial layer 3 is formed on the patterned surface 21 of the substrate 2, has a patterned surface 31 that is in face-to-face contact with the patterned surface 21 of the substrate 2, and is formed with a plurality of protrusions 32 that protrude from the patterned surface 31 of the epitaxial layer 3 and that are respectively received in the cavities 22. Each of the protrusions 32 is polygonal in shape, and defines a plurality of vertices 51, 52, 53. Preferably, the vertices 51, 52, 53 of each of the protrusions 32 contact the cavity-defining wall 24 of the respective one of the cavities 22 so as to form a plurality of closed pores 5 between each of the protrusions 32 and the cavity-defining wall 24 of the respective one of the cavities 22. Preferably, each of the cavities 22 has a depth (so called "step") of less than 0.5 μm relative to the patterned surface 21. More preferably, the depth of each of the cavities 22 ranges from 0.5 μm to 5 μm, and most preferably 1.5 μm. Preferably, two adjacent ones of the cavities 22 are spaced apart from each other by a distance less than 7 μm. More preferably, the distance between the two adjacent ones of the cavities 22 ranges from 2 μm to 7 μm, and most preferably 3 μm.

The epitaxial layer 3 may be formed on the sapphire substrate 2 by lateral epitaxial growth techniques. Preferably, the patterned surface 31 of the epitaxial layer 3 is parallel to the patterned surface 21 of the substrate 2. When the lateral epitaxial growth rate is faster than the longitudinal epitaxial growth rate, a polygonal shape of each of the protrusions 32 can be achieved. In this embodiment, each of the protrusions 32 is substantially triangular in shape.

Figure 14:
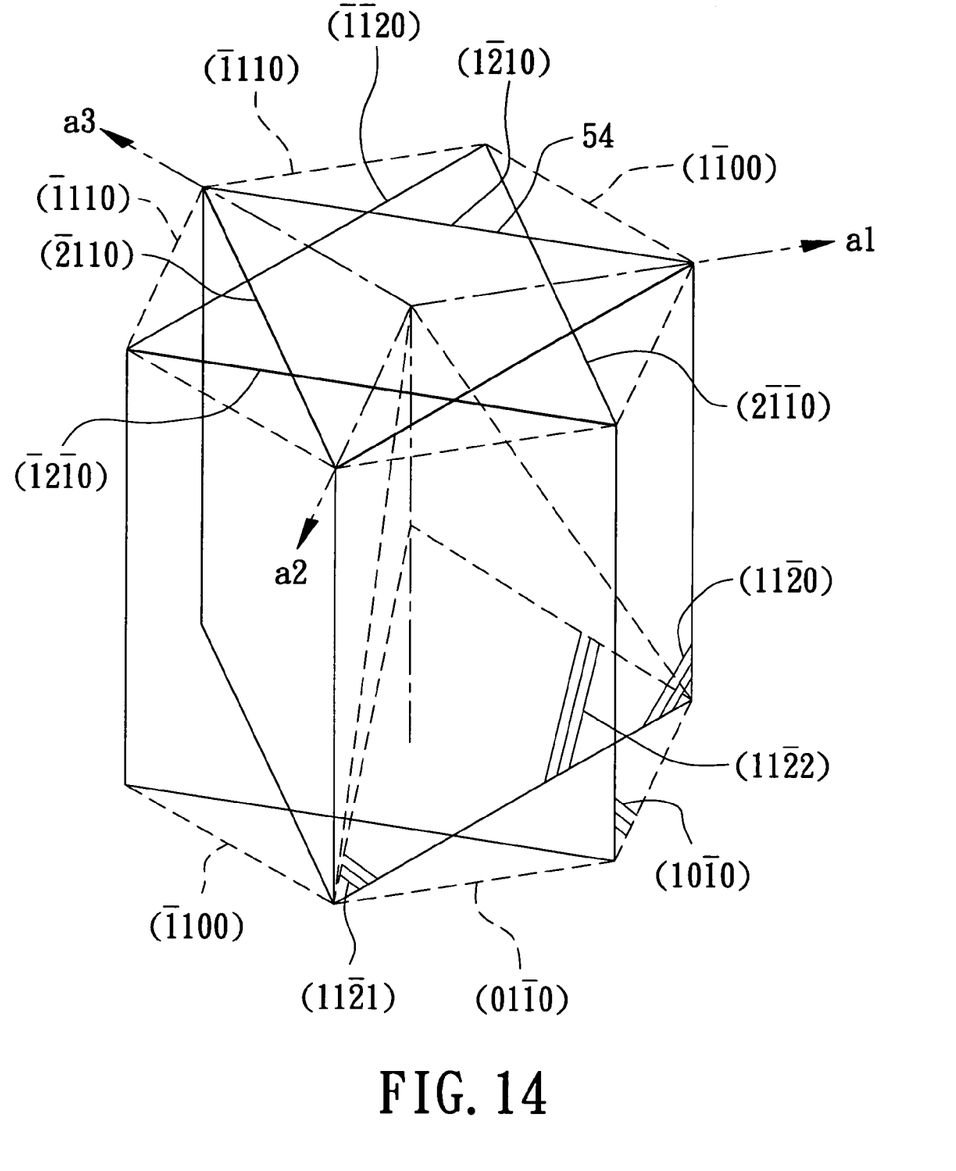
FIG. 14 is a schematic view to illustrate how epitaxial crystals of an epitaxial layer of the light emitting layer grow along desired crystal planes.

Referring to FIG. 14, the epitaxial layer 3 is composed of epitaxial crystals that are hexagonal in shape. Preferably, formation of the epitaxial crystals is controlled at conditions such that the growth of the epitaxial crystals is along crystal planes 54 defined as (11$\bar{2}$z), (1$\bar{2}$1z), ($\bar{2}$11z), ($\bar{1}\bar{1}$2z), ($\bar{1}$2$\bar{1}$z) and (2$\bar{1}\bar{1}$z), wherein z is an integer number from 0 to 2, and more preferably, z is 0.

Preferably, each of the closed pores 5 has a maximum width ranging from 0.01 μm to 1 μm. In addition, the substrate 2 is made from a material selected from the group consisting of sapphire, silicon carbide (SiC), and silicon (Si). Preferably, the substrate 2 is made from sapphire, and the patterned surface 21 thereof is a C face (0001).

Figure 5:
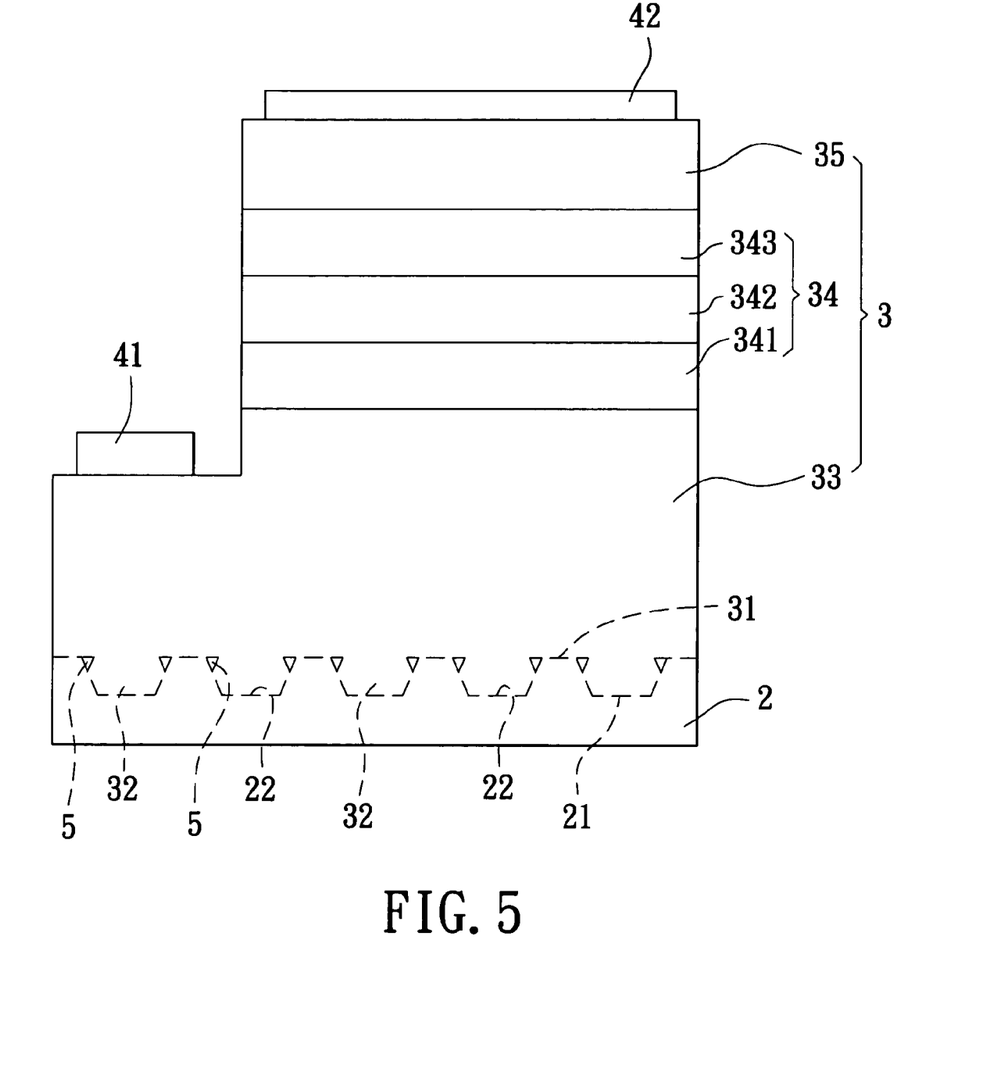
FIG. 5 is a schematic view to illustrate the preferred embodiment of the light emitting device according to the present invention.

Referring to FIG. 5, the epitaxial layer 3 of the preferred embodiment of a light emitting device according to the present invention includes a first semiconductor layer 33 that is formed with the protrusions 32, a light emitting layer 34 formed on the first semiconductor layer 33, and a second semiconductor layer 35 formed on the light emitting layer 34.

Preferably, the epitaxial layer 3 is made from a group III-V compound and is capable of emitting light having a wavelength ranging from 700 nm to 550 nm. Particularly, the group III element included in the group III-V compound is selected from the group consisting of Al, Ga, In, and combinations thereof. The group V element included in the group III-V compound is selected from the group consisting of P and AS.

Alternatively, the epitaxial layer 3 is capable of emitting light having a wavelength ranging from 550 nm to 370 nm. Preferably, the group III element included in the group III-V compound is selected from the group consisting of Al, Ga, In, and combinations thereof. The group V element included in the group III-V compound is N. More preferably, the epitaxial layer 3 is made from GaN.

In addition, preferably, the first semiconductor layer 33 is an n-type semiconductor layer, and the second semiconductor layer 35 is a p-type semiconductor layer.

Preferably, the first semiconductor layer 33 has a first portion, and a second portion that is formed with the light emitting layer 34 thereon. The light emitting device further includes a first contact electrode 41 that is formed on the first portion of the first semiconductor layer 33, and a second contact electrode 42 that is formed on the second semiconductor layer 35.

More preferably, the first semiconductor layer 33 is an n-GaN semiconductor layer, and the second semiconductor layer 35 is a p-GaN semiconductor layer.

Preferably, the first contact electrode 41 is Ti/Al/Ti/Au contact electrode 41, and the second contact electrode 42 is Ni/Au contact electrode.

More preferably, as shown in FIG. 5, the light emitting layer 34 includes an n-AlGaN layer 341 formed on the n-GaN semiconductor layer 33, a multi-quantum wall (MQW) layer 342 that is formed on the n-AlGaN layer 341 and that has a structure of InGaN/GaN, and a p-AlGaN layer 343 formed on the multi-quantum wall (MQW) layer 342 and connected to the p-GaN semiconductor layer 35.

Figure 6:
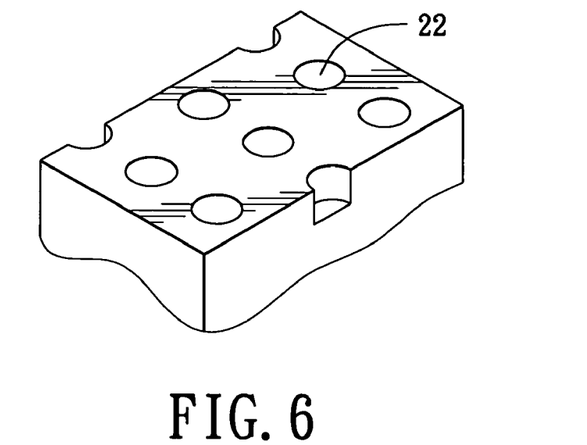
FIG. 6 is a perspective view to illustrate a patterned surface of the preferred embodiment of this invention.

The cavities 22 in the substrate 2 maybe formed through photolithography techniques, preferably dry etching, by using a mask that has a predetermined pattern and that is adapted to be placed on the substrate 2. The predetermined pattern of the mask is selected from the group consisting of an array of circles, an array of equilateral quadrilaterals, an array of equilateral hexagons, and an array of equilateral triangles, so as to produce the cavities 22 in the substrate 2 that are arranged in an array corresponding to the predetermined pattern of the mask. Preferably, the predetermined pattern of the mask is an array of circles, so that the cavities 22 in the substrate 2 have an arrangement of an array of circles, as shown in FIG. 6. Preferably, each of the cavities 22 as shown in FIG. 6 has a diameter d1 less than 7 μm. More preferably, the diameter d1 of each of the cavities 22 ranges from 2 μm to 7 μm, and most preferably 3 μm. Preferably, two adjacent ones of the cavities 22 are spaced apart from each other by a distance less than 7 μm.

Figure 7:
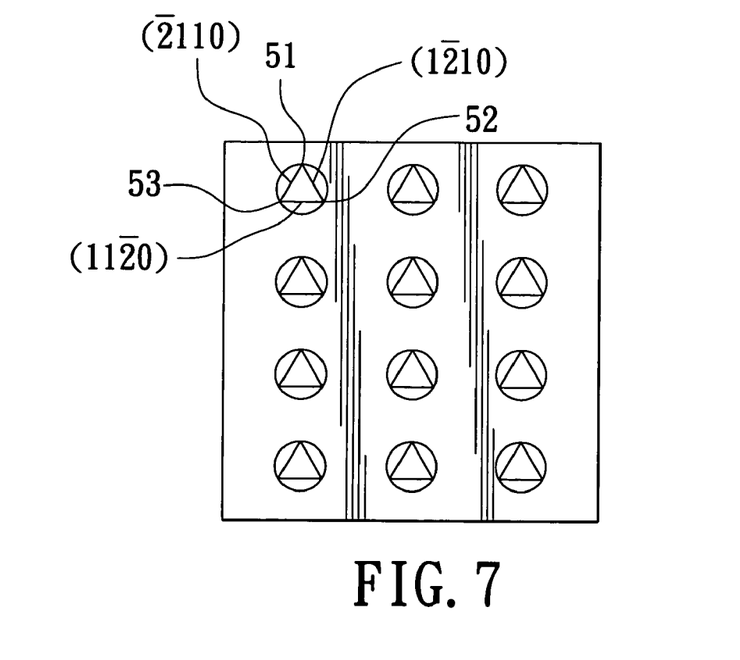
FIG. 7 is a schematic view to illustrate how the epitaxial crystal layer is formed on the substrate of FIG. 6.
Figure 8:
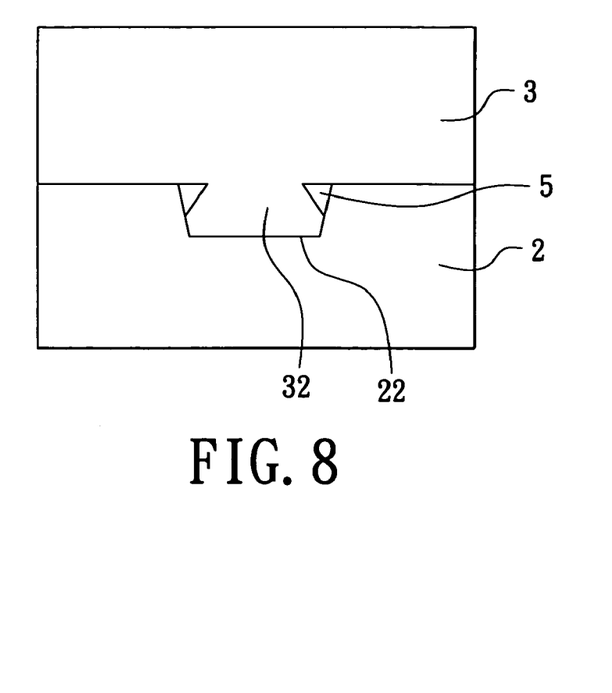
FIG. 8 is a schematic view to illustrate closed pores formed in cavities in the substrate of FIG. 6 after the epitaxial layer is formed.
Figure 11:
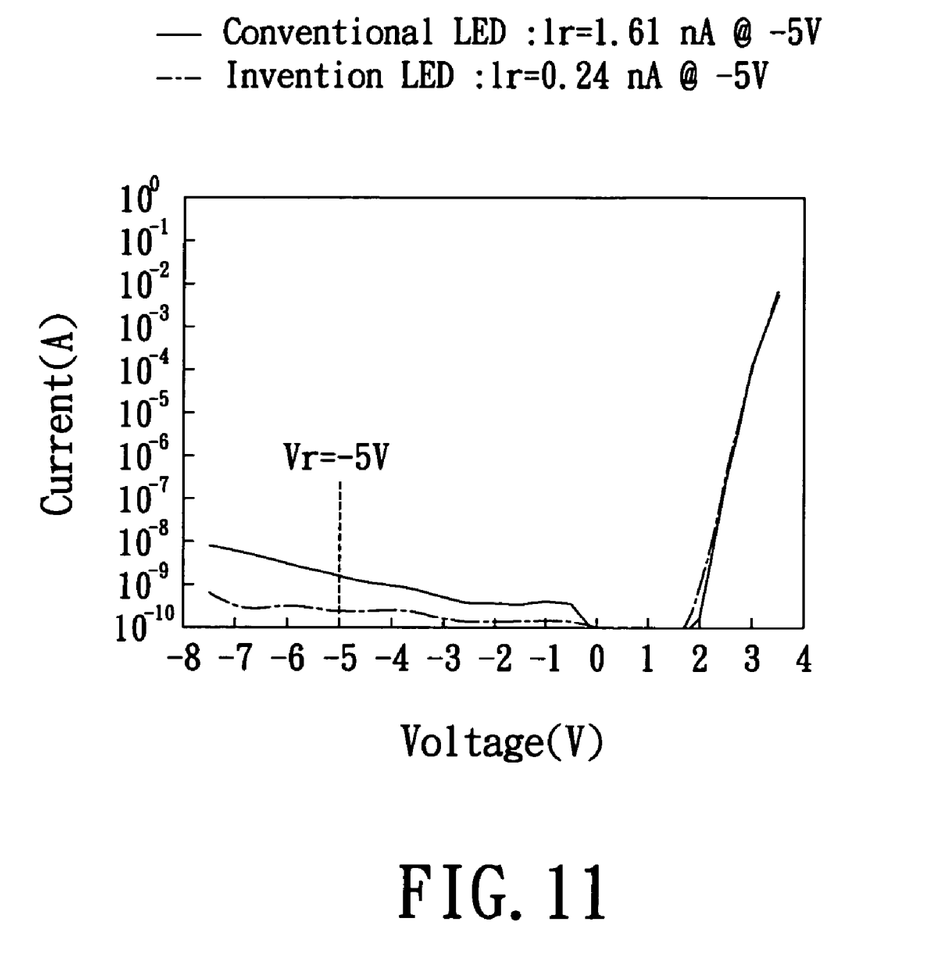
FIG. 11 is a current-and voltage plot to illustrate comparison between the light emitting device of this invention shown in FIG. 5 and a conventional light emitting device in terms of current leakage.

Further referring to FIGS. 7, 8 and 11, when the n-GaN semiconductor layer 33 is formed on the sapphire substrate 2 by controlling the lateral epitaxial growth rate to be larger than the longitudinal epitaxial growth rate, the growth of the crystals of the expitaxial layer 3 is along the crystal planes 54 of $(11\bar{2}0)$, $(1\bar{2}10)$, and $(\bar{2}110)$ such that each of the protrusions 32 is trianglular in shape and that the three vertices 51, 52, 53 defined by each of the protrusions 32 contact the cavity-defining wall 24 of the respective cavity 22, so as to form three closed pores 5 (only two of the closed pores 5 are shown in FIG. 8).

Figure 9:
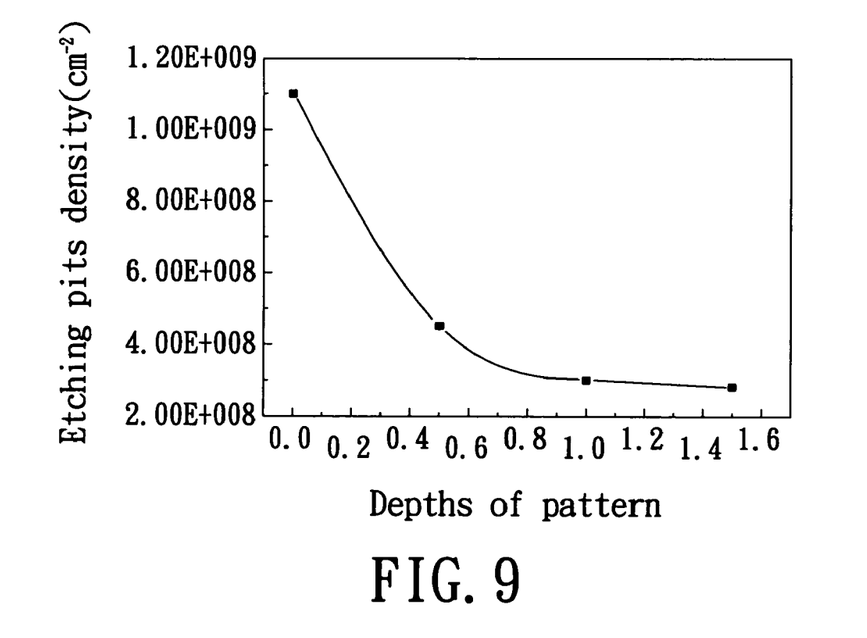
FIG. 9 is a plot to illustrate the relationship between the dislocation density in terms of etching pits density and the depths of cavities in the substrate.

Referring to FIG. 9, the relationship between the dislocation density of the n-GaN semiconductor layer 33 in terms of etching pits density and the depths of the cavities 22 in the sapphire substrate 2 is illustrated. From the results shown in the plot of FIG. 9, the dislocation density of the n-GaN semiconductor layer 33 is decreased with an increase in the depths of the cavities 22.

Figure 10:
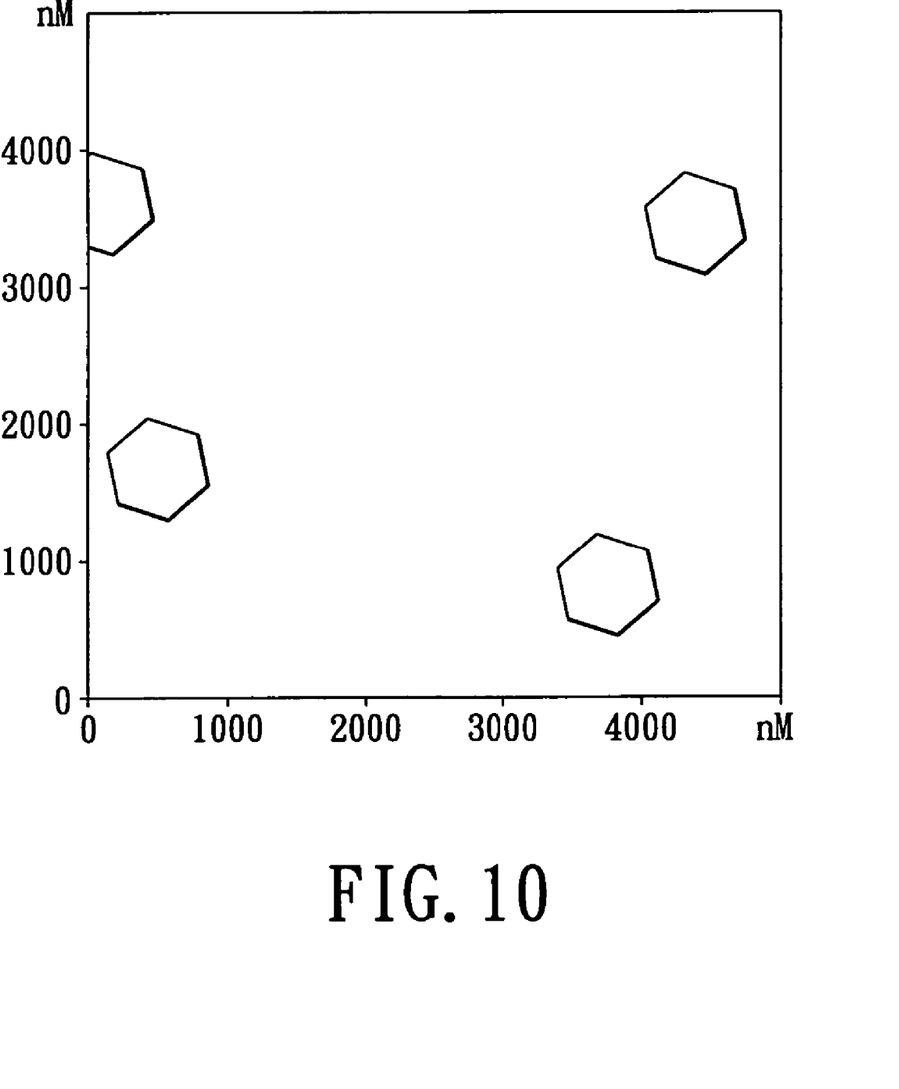
FIG. 10 is a perspective view to illustrate hexagonal threading dislocation formed in the epitaxial layer of FIG. 7.

An example of the dislocation density of the n-GaN semiconductor layer 33 of the preferred embodiment is shown in FIG. 10. In this example, the n-GaN semiconductor layer 33 has hexagonal threading dislocation. The dislocation density of the n-GaN semiconductor layer 33 is formed after the epitaxial layer 3 is wet etched in the $H_2SO_4/H_3PO_4$ (1:1) solution and is less than $3 \times 10^8$ cm$^{-2}$.

FIG. 11 illustrates comparison between the light emitting device of this invention shown in FIG. 5 and a conventional light emitting device in terms of current leakage. From the result of the plot shown in FIG. 11, at a voltage of −5V, the reverse leakage current ($I_r$) of the light emitting device of this invention that has the closed pores 5 is only 0.24 nA, and is much lower than that of the conventional light emitting device that includes an unpatterned sapphire substrate and has no closed pores.

Figure 12:
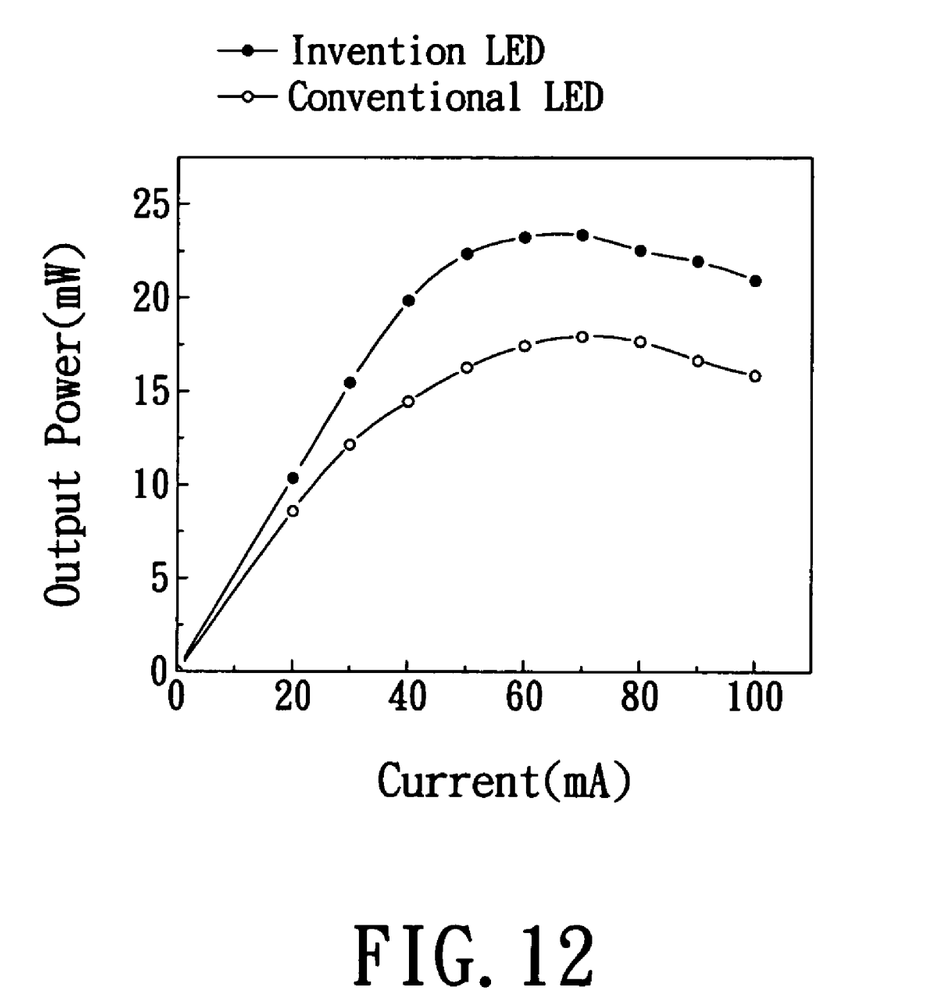
FIG. 12 is a current-and-output power plot to illustrate comparison between the light emitting device of this invention shown in FIG. 5 and a conventional light emitting device in output power.

FIG. 12 illustrates comparison of the light emitting device of this invention shown in FIG. 5 and a conventional light emitting device in terms of output power. From the result of the plot shown in FIG. 12, the light emitting device of this invention that has the closed pores 5 has a higher output power than that of the conventional light emitting device that includes an unpatterned sapphire substrate and has no closed pores.

Figure 13:
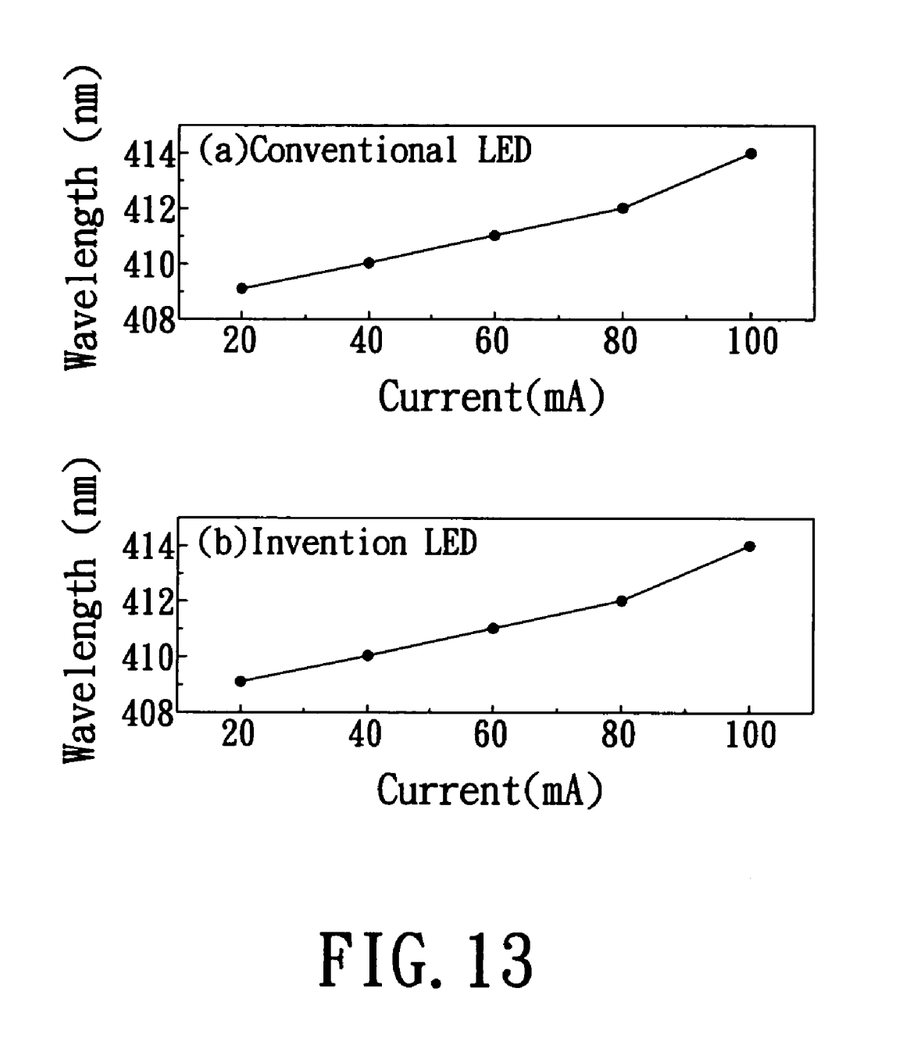
FIG. 13 is a plot to illustrate comparison between the light emitting device of this invention shown in FIG. 5 and a conventional light emitting device in the extent of wavelength shift.

FIG. 13 illustrates comparison of the light emitting device of this invention shown in FIG. 5 and a conventional light emitting device in terms of wavelength shift in the electroluminescence spectrum. In a light emitting device, poor heat-dissipating efficiency is the main cause for the wavelength shift in the electroluminescence spectrum. In addition, if the size of the closed pores 5 between each of the protrusions 32 and the cavity-defining wall 24 of the respective one of the cavities 22 is too large, the heat-dissipating efficiency of the light emitting device will be poor. From the result of the plots shown in FIG. 13, the extent of wavelength shift of the light emitting device of this invention is almost identical to that of the conventional light emitting device. Since the size of the closed pores 5 is relatively small, the heat-dissipating efficiency of the light emitting device of this invention is not affected significantly.

According to this invention, formation of the closed pores 5 results in a decrease in the contact area between the sapphire substrate 2 and the epitaxial layer 3, so as to decrease the dislocation density of the epitaxial layer 3 and so as to enhance the internal quantum efficiency.

On the other hand, formation of the closed pores 5 results in scattering or diffraction of the light beams from the light emitting layer 34 of the epitaxial layer 3 so as to reduce absorption and decay of the light beams due to lateral transmission and so as to enhance external quantum efficiency of the light emitting device. Therefore, the light emitting device of this invention has an output power higher than that of the conventional light emitting device under the same output current.

Besides, since the size of the closed pores 5 is less than 1 μm, the closed pores 5 will not have a significant adverse effect on the heat-dissipating efficiency of the light emitting device.

While the present invention has been described in connection with what is considered the most practical and preferred embodiment, it is understood that this invention is not limited to the disclosed embodiment but is intended to cover various arrangements included within the spirit and scope of the broadest interpretation and equivalent arrangements.

We claim:

1. A light emitting device, comprising:
   a substrate having a patterned surface and formed with a plurality of spaced apart cavities that are indented inwardly from said patterned surface, each of said cavities being defined by a cavity-defining wall; and
   an epitaxial layer formed on said patterned surface of said substrate, having a patterned surface that is in face-to-face contact with said patterned surface of said substrate, and formed with a plurality of protrusions that protrude from said patterned surface of said epitaxial layer and that are respectively received in said cavities, each of said protrusions being polygonal in shape and defining a plurality of vertices;
   wherein said vertices of each of said protrusions contact said cavity-defining wall of the respective one of said cavities so as to form a plurality of closed pores between each of said protrusions and said cavity-defining wall of the respective one of said cavities.

2. The light emitting device of claim 1, wherein each of said cavities has a depth ranging from 0.5 to 5 μm relative to said patterned surface of said substrate.

3. The light emitting device of claim 2, wherein each of said cavities has a circular shape and has a diameter ranging from 2 to 7 μm.

4. The light emitting device of claim 3, wherein two adjacent ones of said cavities are spaced apart from each other by a distance ranging from 2 to 7 μm.

5. The light emitting device as claimed in claim 4, wherein each of said closed pores has a maximum width ranging from 0.01 μm to 1 μm.

6. The light emitting device of claim 1, wherein two adjacent ones of said cavities are spaced apart from each other by a distance ranging from 2 to 7 μm.

7. The light emitting device as claimed in claim 1, wherein each of said closed pores has a maximum width ranging from 0.01 μm to 1 μm.

8. The light emitting device as claimed in claim 1, wherein said substrate is made from a material selected from the group consisting of sapphire, silicon carbide (SiC), and silicon (Si).

9. The light emitting device as claimed in claim 8, wherein said substrate is made from sapphire.

10. The light emitting device as claimed in claim 1, wherein said epitaxial layer includes a first semiconductor layer formed on the sapphire substrate, a light emitting layer formed on said first semiconductor layer, and a second semiconductor layer formed on said light emitting layer.

11. The light emitting device as claimed in claim 10, wherein said epitaxial layer is made from a group III-V compound.

12. The light emitting device as claimed in claim 10, wherein said first semiconductor layer is an n-type semiconductor layer, and said second semiconductor layer is a p-type semiconductor layer.

13. The light emitting device as claimed in claim 10, wherein said first semiconductor layer has a first portion and a second portion that is formed with said light emitting layer, said light emitting device further comprising a first contact electrode that is formed on said first portion of said first semiconductor layer, and a second contact electrode that is formed on said second semiconductor layer.

14. The light emitting device as claimed in claim 1, wherein said epitaxial layer comprises epitaxial crystals that are hexagonal in shape and that are formed by growing along crystal planes defined as $(11\bar{2}z)$, $(1\bar{2}1z)$, $(\bar{2}11z)$, $(\bar{1}\bar{1}2z)$, $(\bar{1}2\bar{1}z)$ and $(2\bar{1}\bar{1}z)$, respectively, wherein z is an integer number from 0 to 2.

15. The light emitting device as claimed in claim 14, wherein z is 0.

* * * * *